United States Patent
Komatsu et al.

(10) Patent No.: US 6,791,260 B2
(45) Date of Patent: Sep. 14, 2004

(54) ORGANIC ELECTROLUMINESCENT ELEMENT, PANEL AND APPARATUS USING THE SAME

(75) Inventors: Takahiro Komatsu, Osaka (JP); Akira Gyotoku, Osaka (JP); Takafumi Hamano, Osaka (JP); Shinichiro Kaneko, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 108 days.

(21) Appl. No.: 10/051,298

(22) Filed: Jan. 22, 2002

(65) Prior Publication Data
US 2003/0117070 A1 Jun. 26, 2003

(30) Foreign Application Priority Data
Jan. 22, 2001 (JP) ......................... 2001-012774

(51) Int. Cl.[7] ................... H05B 33/00; H05B 33/26
(52) U.S. Cl. .................. 313/504; 313/506; 313/509
(58) Field of Search .................. 313/504, 506, 313/509, 512, 511, 500

(56) References Cited

U.S. PATENT DOCUMENTS

| | | | | |
|---|---|---|---|---|
| 4,006,383 A | * | 2/1977 | Luo et al. ............. | 313/509 |
| 4,757,235 A | * | 7/1988 | Nunomura et al. ..... | 313/509 |
| 5,757,139 A | * | 5/1998 | Forrest et al. ........ | 315/169.3 |
| 5,837,391 A | * | 11/1998 | Utsugi ................ | 313/504 |
| 6,337,492 B1 | * | 1/2002 | Jones et al. .......... | 313/504 |

FOREIGN PATENT DOCUMENTS

| | | |
|---|---|---|
| JP | 4-308687 | 10/1992 |
| JP | 9-139286 | 5/1997 |
| JP | 11-121168 | 4/1999 |
| JP | 2000-29432 | 1/2000 |

OTHER PUBLICATIONS

"Organic Electroluminescent Diodes" C. W. Tang, et al., Appl. Phys. Lett. vol. 51, No. 12, Sep. 1987, pp. 913–915.

* cited by examiner

Primary Examiner—Nimeshkumar D. Patel
Assistant Examiner—Mariceli Santiago
(74) Attorney, Agent, or Firm—McDermott Will & Emery

(57) ABSTRACT

An organic electroluminescent (OEL) element includes a scanning electrode and a signal electrode, which crosses the scanning electrode at right angles, on a substrate. The signal electrodes are formed of N-layer electrodes laminated like steps, where respective layers are insulated from each other. The scanning electrodes are formed on the signal electrodes via an organic thin film layer. As a result, a display area is divided into sections corresponding to laminated numbers, and the divided each section is scanned independently. A duty ratio for driving the OEL element becomes large and less power consumption thus can be expected.

27 Claims, 9 Drawing Sheets

FIG. 6 (a1) 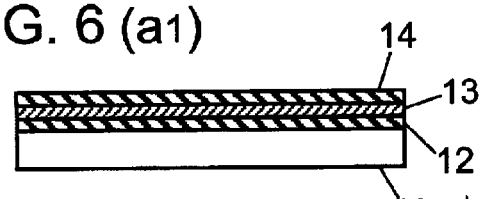
FIG. 6 (a2) 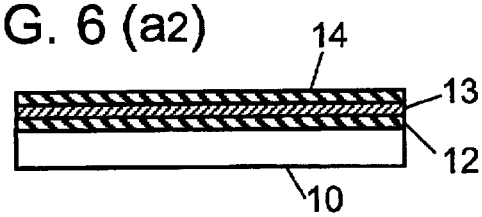
FIG. 6 (b1) 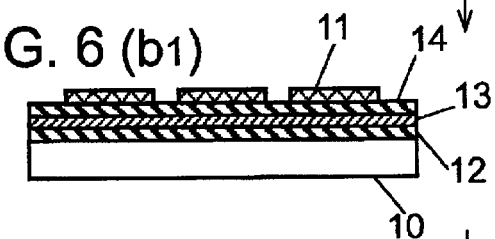
FIG. 6 (b2) 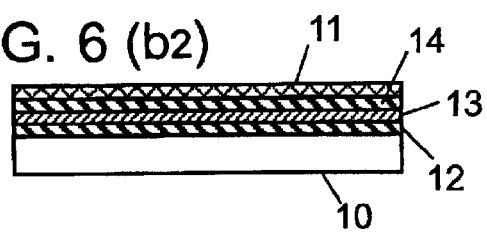
FIG. 6 (c1) 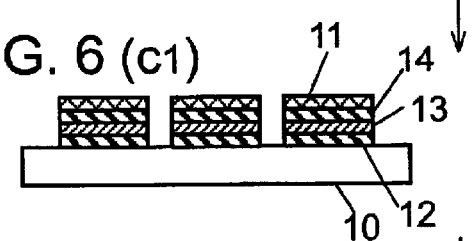
FIG. 6 (c2) 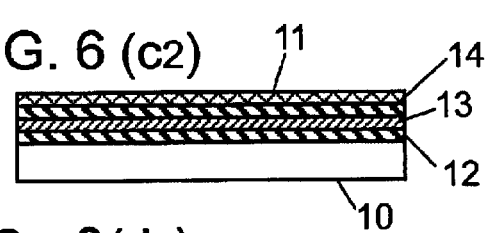
FIG. 6 (d1) 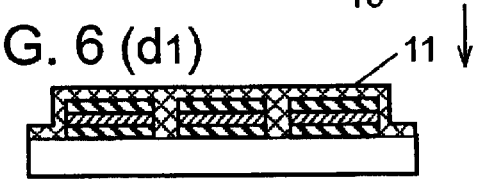
FIG. 6 (d2) 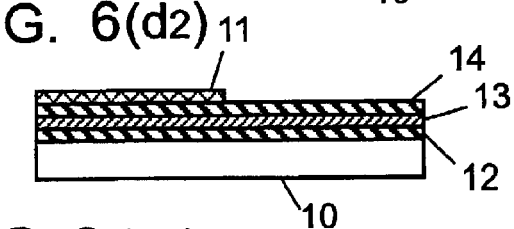
FIG. 6 (e1) 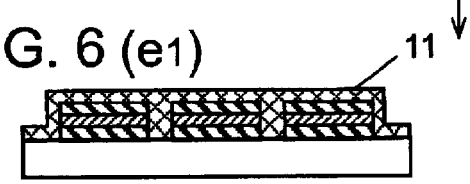
FIG. 6 (e2) 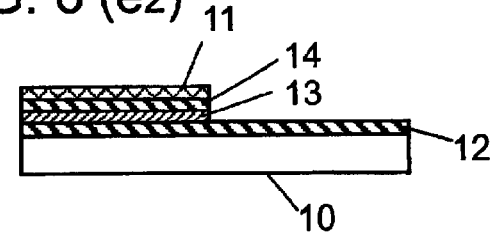
FIG. 6 (f1) 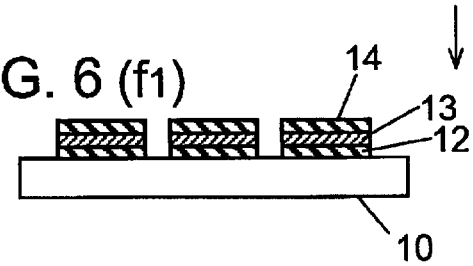
FIG. 6 (f2) 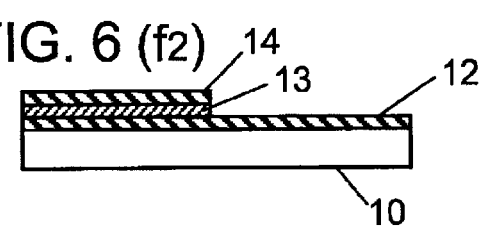

ORGANIC ELECTROLUMINESCENT ELEMENT, PANEL AND APPARATUS USING THE SAME

FIELD OF THE INVENTION

This invention relates to an organic electroluminescent (OEL) element, an OEL panel and an OEL apparatus using the same. The OEL element and the OEL panel are used for a display device, a light source of a display device, a backlight, a light-emitting device used in an optical communication apparatus and the like.

BACKGROUND OF THE INVENTION

An electroluminescent element is a light-emitting device utilizing electroluminescence of solid fluorescent material. An inorganic electroluminescent element using inorganic material as a light-emitting device has been commercialized and has been used for a backlight of a liquid crystal display and so on. On the other hand, an electroluminescent element using organic material has been studied for years, but has not yet been in the actual use, because its luminous efficiency is very low.

A multilayer type organic electroluminescent (OEL) element was reported by C. W. Tang et al. in Eastman Kodak Company in 1987, where the OEL element was formed of two layers (a hole transporting layer and an emitting layer). According to the report, the OEL element showed high light brightness (at least 1000 cd/m$^2$) even if its driving voltage was low (as low as 10V). [cf. C. W. Tang and S. A. Van slyke: Apply. Phys. Lett., 51, 913 (1987)]. Since then, OEL elements have drawn additional attention, and research and development involving OEL elements has increased. As a result of this activity, OEL elements have been commercialized.

A structure of a conventional OEL element is described hereinafter with reference to FIG. 8. As shown in FIG. 8, an OEL element includes anode 2, organic hole-transporting layer 4, organic light emitting layer 5 and cathode 6, where anode 2 is formed on transparent substrate 1, e.g., glass. Generally, anode 2 is a transparent conductive layer, e.g., indium tin oxide (ITO), formed by a sputtering method or a resistor-heating vacuum deposition and the like. Hole transporting layer 4 is a deposited organic thin layer, e.g., N,N'-diphenyl-N,N'-bis(3-methylphenyl)-1,1'-diphenyl-4,4'-diamine(TPD). Organic light emitting layer 5 is a deposited organic thin layer, e.g., 8-Hydroxyquinoline Aluminum (Alq 3). Cathode 6 is a metal layer whose thickness ranges from 100 nm to 300 nm.

When a DC voltage is applied between anode 2 and cathode 6 of the OEL element, holes are injected from anode 2 to emitting layer 5 via hole-transporting layer 4, and electrons are injected from cathode 6 to emitting layer 5. Holes and electrons are recombined in emitting layer 5, and excitons are produced. Light emission occurs when excitons transmit from an excited state to a ground state.

When the OEL element is used for a display device, it can be applied for a dot matrix panel whose pixels are arrayed in a matrix, where the pixels are formed of an anode, organic material and a cathode.

Two driving methods of the dot matrix panel have been proposed. One is an active matrix method (AM method) which is disclosed in Japanese Patent Non-Examined Publication No. H09-139286. In accordance with the AM method, every pixel has a thin film transistor (TFT) and is controlled individually. Another method is a passive matrix method (PM method) which uses no TFTs. In the PM method, a panel is driven line by line sequentially by the PM method.

The OEL element can be used for both methods because the response of the OEL is very fast. The PM method—differing from the AM method—needs not to have a TFT in every pixel. The number of manufacturing processes of the PM method are fewer than that of the AM method, and a production cost of the PM method can be lower than that of the AM method. From a viewpoint of power consumption, however, the AM method is advantageous, particularly, the more the number of pixels increases, the more the AM method become advantageous.

The reason of increasing power consumption by the PM method is described hereinafter with reference to FIG. 9. As shown in FIG. 9, striped anode 2 crosses cathode 6 at right angles. Organic thin film 3 is sandwiched between two electrodes (anode 2 and cathode 6), so that the OEL element is formed. The OEL element emits light at an intersection, i.e., single pixel 500, of the electrodes. FIG. 9 shows a schematic view of a conventional display panel by the PM method. A plurality of pixels 500 are arrayed in matrix on the display. Respective scanning lines (cathode lines in FIG. 9) are scanned sequentially, and at that time, a data line corresponding to a pixel desired to emit needs to be turned on. As a result, an arbitrary pixel for display emits light.

In the PM method, a time span, in which one line of the OEL emits, is described as follows:

flame time/the number of scanning lines and a duty ratio is described as follows:

1/the number of scanning lines

When the number of scanning lines is increased, instantaneous brightness, at which one line of the OEL emits during the time span, needs to be increased proportionately.

In an OEL element, a driving current is generally proportional to brightness, when the brightness is low. When the number of scanning lines is increased, more the current is required, because high instantaneous brightness is needed. When emission brightness is high, the proportionality mentioned above does not hold, so that much more current is needed. On the other hand, in the AM method, high instantaneous brightness is not required because every pixel has a TFT. The more the number of pixels increases, the greater a difference of power consumption between the AM method and the PM method becomes.

When the number of pixels increases, crosstalk tends to appear when utilizing the PM method. Crosstalk is a phenomenon in which not only a selected line but also an unselected line around the selected line emits light. Another electric power is needed to reduce the crosstalk besides the electric power for emitting. A reverse-bias method, one of measures against the crosstalk, is disclosed in Japanese Patent Non-Examined Publication No. H04-308687. In the reverse-bias method, the voltage is applied to an unselected line in a reverse direction of the selected line (emission line). Electric power consumed by the reverse-bias method causes the increase of power consumption by the PM method. The more the number of pixels increases, the greater a difference of power consumption between the AM method and the PM method becomes.

One of the measures for reducing power consumption is to lower the instantaneous brightness. For example, the method, by which a display area is divided into more than two areas and the divided areas are driven respectively, is disclosed in Japanese Patent Application Non-Examined Publication No. 2000-29432. By the method mentioned above, the number of electric wirings increases responsive to the increase of the number of divided sections. As a result, the space required for electric wirings becomes large and an emission area is reduced.

SUMMARY OF THE INVENTION

The present invention addresses the problems discussed above, and aims to provide an inexpensive organic electroluminescent (OEL) element for a dot matrix panel consuming lower power. Accordingly, this invention provides an OEL panel and an OEL apparatus using the OEL element.

An exemplary OEL element of this invention includes a scanning electrode, an organic thin film and a signal electrode.

The signal electrodes are formed of N-layer laminated electrodes, where respective layers are insulated from each other. Layer M is formed on layer (M−1) via the insulator, where M is an integer not more than an integer N (N>M) and greater than 1, and where the area of layer M is smaller than that of layer (M−1). The organic thin film and the scanning electrode are formed on layer N and on layer (M−1) not covered with layer M. As a result, one substrate is divided into N sections and the divided sections are scanned respectively. Thus, the duty ratio for driving the OEL element becomes larger and power consumption becomes smaller.

The OEL element of the present invention can be easily coupled to an external circuit and the reliability of the OEL element is improved because all of lead-wires from the signal electrodes are routed in the same direction on the substrate.

An OEL apparatus of the present invention includes at least one driving IC and the driving IC scans each divided section independently, where one display area in the OEL element is divided into sections.

Several OEL elements can be arrayed on one substrate, so that a display area is divided into a greater number of sections, and a duty ratio for driving the OEL element becomes larger and therefore less power consumption can be expected.

BRIEF DESCRIPTION OF THE DRAWINGS

FIGS. 6($a$1)–6($f$2) show laminated layer structures in respective manufacturing processes of an OEL element in accordance with a second exemplary embodiment of the present invention.

DESCRIPTION OF THE PREFERRED EMBODIMENT

Figure 1:
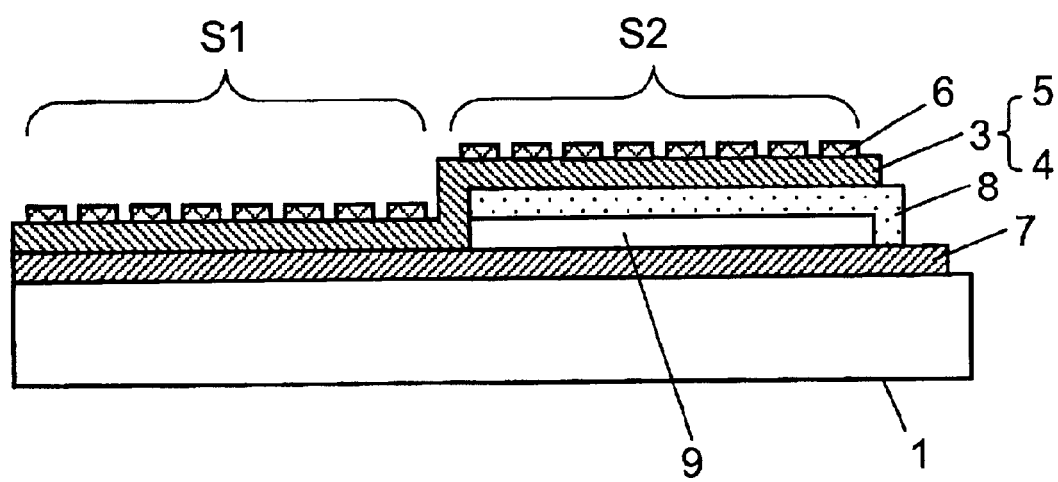
FIG. 1 illustrates a sectional view of an organic electroluminescent (OEL) element in accordance with an exemplary first embodiment of the present invention.

An organic electroluminescent (OEL) element of the present invention is demonstrated hereinafter with reference to the accompanying drawings.

A transparent substrate having mechanical strength and thermal durability is used as a substrate in the OEL element of this invention.

Transparent materials, e.g., a glass, polyethyleneterephthalate, polycarbonate, polymethylmethacrylate, polyethersulfone, polyvinylfluoride, polypropylene, polyethylene, polyacrylates, amorphous polyolefin fluorocarbon resin, can be used for the substrate. A flexible film substrate formed of the material described above can be also used.

Material having high transparency at a specific wavelength or having wavelength-conversion function can be also used for a certain application.

Although an insulated substrate is preferable, the substrate isn't limited to an insulator. Resistive material is also acceptable as the substrate so far as it does not impede driving of the OEL element. Conductive material can be used for certain applications. The definition of a transparent or a translucent substrate in this invention indicates that the substrate does not significantly absorb a specific wavelength emitted by the OEL.

Transparent material, e.g., ITO, ATO ($SnO_2$ doped Sb), AZO (ZnO doped Al), is suitable for an anode of the OEL element.

One of the following structures can be used for the organic thin film:

(a) a single-layer structure comprising an emitting layer;

(b) a two-layer structure comprising a hole transporting layer and an emitting layer;

(c) a two-layer structure comprising an emitting layer and an electron transporting layer;

(d) a three-layer structure comprising a hole transporting layer, an emitting layer and an electron transporting layer.

In the case of the two-layer structure or three-layer structure, a hole transporting layer is laminated on an anode, or a cathode is laminated on electron transporting layer.

Alq 3 or Be-benzoquinolinol (BeBq2) is suitable for the emitting layer, because they are fluorescent materials having fluorescent characteristics in a visible region and they are easily vacuum deposited.

The following materials can be also used for the emitting layer:

(a) benzoxazole derivatives, e.g., 2,5-bis-(5,7-di-t-pentyl-2-benzoxazolyl)-1,3,4-thiadiazole, 4,4'-bis-(5,7-bentil-2-benzoxazolyl) stilbene, 4,4'-bis-[5,7-di-(2-methyl-2-butyl)-2-benzoxazolyl]stilbene, 2,5-bis-(5,7-di-t-benzyl-2-benzoxazolyl)thiophene, 2,5-bis-([5-α, α-dimethylbenzyl]-2-benzoxazolyl)thiophene, 2,5-bis-[5,7-di-(2-methyl-2-butyl)-2-benzoxazolyl-3,4-diphenylthiophene, 2,5-bis-(5-methyl-2-benzoxazolyl)

thiophene, 4,4-bis-(2-benzoxazolyl)biphenyl, 5-methyl-2-[2-[4-(5-methyl-2-benzoxazolyl)phenyl] vinyl]benzoxazolyl, 2-[2-(4-chlorophenyl)vinyl] naphtho[1,2-d]oxazole;

(b) benzothiazole derivatives, e.g., 2,2'-(p-phenylenedivinylene)-bisbenzothiazole;

(c) benzimidazole derivatives, e.g., 2-[2-[4-(2-benzimidazolyl) phenyl]vinyl]benzimidazole, 2-[2-(4-carboxyphenyl) vinyl]benzimidazole;

(e) 8-hydroxyquinoline metal complexes, e.g., tris-(8-quinolinol)aluminum, bis-(8-quinolinol)magnesium, bis-(benzo[f]-8-quinolinol) zinc, bis-(2-methyl-8-quinolinolate)aluminumoxide, tris-(8-quinolinol) indium, tris(5-methyl-8-quinolinol)aluminum, 8-quinolinol lithium, tris-(5-chloro-8-quinolinol) gallium, bis-(5-chloro-8-quinolinol)calcium, poly [zinc-bis(8-hydroxy-5-quinolinonyl)methane];

(f) metal chelate oxinoides, e.g., dilitium epindolidion;

(g) styrylbenzene derivatives, e.g., 1,4-bis-(2-methylstyryl) benzene, 1,4-(3-methylstyryl) benzene, 1,4-bis-(4-methylstyryl) benzene, distyryl benzene, 1,4-bis (2-ethylstyryl)benzene, 1,4-bis-(3-ethylstyryl) benzene, 1,4-bis-(2-methylstyryl)2-methylbenzene;

(h) distyrylpyrazine derivatives, e.g., 2,5-bis-(4-methylstyryl)pyrazine, 2,5-bis-(4-ethylstyryl)pyrazine, 2,5-bis-[2-(1-naphthyl)vinyl]pyrazine, 2,5-bis-(4-methoxystyryl)pyrazine, 2,5-bis-[2-(4-biphenyl)vinyl] pyrazine, 2,5-bis-[2-(1-pyrenel)vinyl]pyrazine; and (i) naphthalimide derivatives, perylene derivatives, oxadiazole derivatives, aldazine derivatives, cyclopentadiene derivatives, styrylamine derivatives, coumarin derivatives, aromatic dimethylidine derivatives, anthracene, salicylic chloride, pyrene, coronene.

TPD is desirable for the hole transporting layer, because TPD has high hole mobility and high transparency, and TPD is deposited well.

The following organic materials can be also used for the hole transporting layer:

(a) porphyrin derivatives, e.g., porphine, tetraphenylporphine copper, phthalocyanine, copper phthalocyanine, titanium phthalocyanineoxide;

(b) aromatic tertiaryamine, e.g., 1,1-bis-{4-(di-p-tolylamino)phenyl}cyclohexane, 4,4',4"-trimethyltriphenylamine, N,N,N',N'-tetrakis(p-tolyl)-p-phenylenediamine, 1-(N,N-di-p-tolylamino) naphthalene, 4,4'-bis-(dimethylamino)-2-2'-dimethyltriphenylmethane, N,N,N',N',-tetraphenyl-4, 4'-diaminobiphenyl, N,N'-diphenyl-N,N'-di-m-tolyl-4, 4'diaminobiphenyl, N-phenylcarbazole; and (c) stilbene derivatives, e.g., 4-di-p-tolylaminostilbene, 4-(di-p-tolylamino)-4'-[4-(di-p-tolylamino)styryl] stilbene; and triazole derivatives, oxadiazole derivatives, imidazole derivatives, polyallylalkane derivatives, pyrazoline derivatives, pyrazolone derivatives, phenylenediamine derivatives, anilamine derivatives, amino substituted chalcone derivatives, oxazole derivatives, styrylanthracene derivatives, fluorenone derivatives, hydrazone derivatives, silazane derivatives, polyshiran derivatives aniline derivatives copolymer, oligomer, styrylamine compound, aromatic dimethylidine derivatives compound, e.g., poly-3-methylthiophene. Polymer type hole transporting material (low-molecular weight material hole transporting layer material dispersed in polymer, e.g., polycarbonate,) is also used for the hole transporting layer.

Oxadiazole derivatives, e.g., 1–3-bis-(4-tert-butylphenyl-1,3,4-oxadiazolyl)phenylene(OXD-7), anthraquinodimethane derivatives, diphenylquinone derivatives can be used for the electron transporting layer.

A metal or an alloy whose work function is low can be used for a cathode. For example, metals, e.g., Al, In, Mg, Ti, Mg alloys, e.g., Mg—Ag alloy, Mg—In alloy, and Al alloys, e.g., Al—Li alloy, Al—Sr alloy, Al—Ba alloy, can be used for a cathode.

The embodiments of the present invention are demonstrated hereinafter with reference to FIGS. 1 to 5.

First Embodiment

The present invention relates to a structure of an organic electroluminescent (OEL) element, including an anode, which functions as a signal electrode, and a cathode, which functions as a scanning electrode in the first embodiment.

Figure 2:
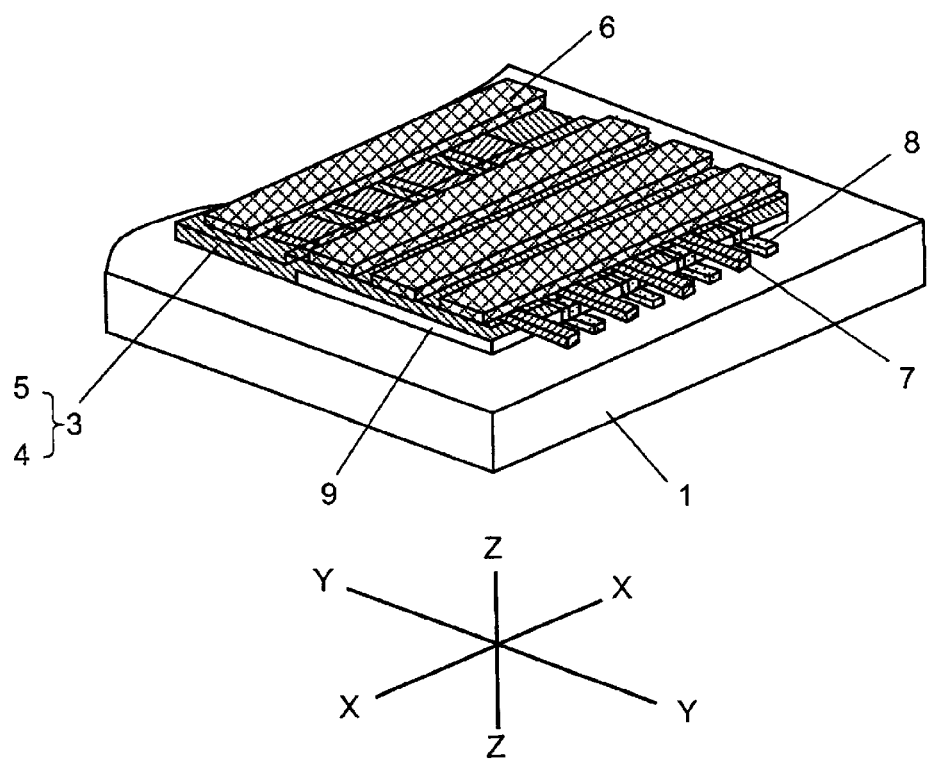
FIG. 2 shows a perspective view of an OEL element in accordance with the first embodiment of the invention.

As shown in FIG. 1 and FIG. 2, in the OEL element of the first embodiment, an insulator 9 and second anode 8 are laminated on first anode 7 (a signal electrode). Even if lead-wires of anodes are routed in one direction, a display area can be divided into more than two sections according to this layer structure. As a result, a duty ratio becomes larger and power consumption thus becomes smaller.

As shown in FIG. 1, the relationship between a surface area of first anode 7 and that of second anode 8 is described as follows:

the surface area of first anode 7 > the surface area of second anode 8 where, second anode 8 is laminated on first anode 7 via insulator 9. As shown in FIG. 1, it is desirable that second anode 8 is laminated on first anode 7 so as to form a step. In this embodiment, organic thin film 3 is described as a two-layer structure formed of hole transporting layer 4 and emitting layer 5, however, the structure of the organic thin film isn't limited to the two-layer structure as described above.

Material, through which light emitted from the organic thin film can transmit, is used for insulator 9. For example, metal-oxides, e.g., $SiO_2$, $TiO_2$, $Al_2O_3$, metal-oxide-nitrides e.g., SiON, metal-nitrides, e.g., AlN, SiN can be used for the organic thin film.

In the OEL element of this embodiment, as shown in FIG. 2, the anodes are laminated 2-layers (N=2) insulated from each other even if a display area is divided into 2 sections (N=2) and the divided display sections are driven respectively. As a result, lead-wires of anodes can be routed in the same direction on the substrate and the OEL element can be connected to an external circuit (not shown).

Second anode 8 is laminated on first anode 7 via insulator 9, and lead-wires from electrodes (anodes) are formed on the same plane of substrate 1. The OEL element having this structure is easily connected to an external circuit and the reliability of the OEL element is improved.

In the first embodiment, a display area is divided into two sections, where first anode 7 (a signal electrode) and second anode 8 (a signal electrode) are laminated via insulator 9. Cathode lines (scanning lines) of each display section is scanned independently. The following structure can be also used. A cathode is used for a signal electrode and a display area is divided into sections, where the cathodes are laminated via an insulator. Anode lines (scanning lines) of each display section is scanned independently.

Figure 3:
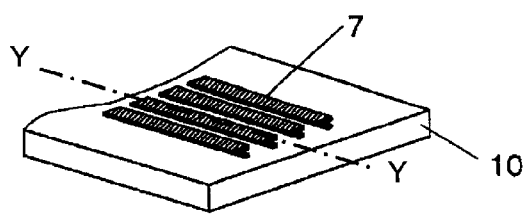
FIGS. 3($a$1)–3($f$2) show a perspective view and a sectional view illustrating laminated layer structures in respective manufacturing processes of an OEL element in accordance with the first embodiment of the invention.
Figure 3:
Figure 3:
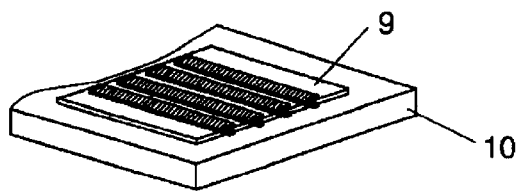
Figure 3:
Figure 3:
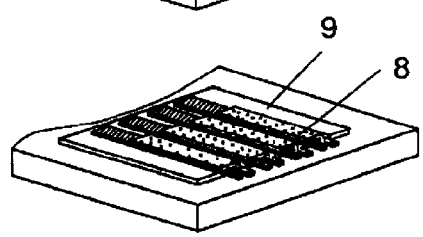
Figure 3:
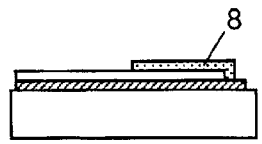
Figure 3:
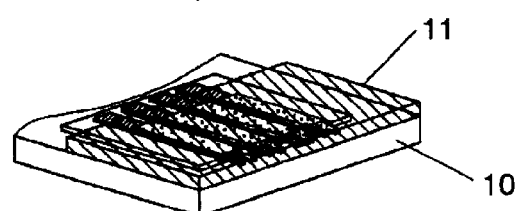
Figure 3:
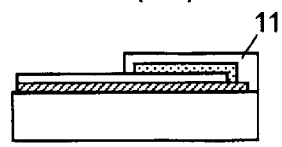
Figure 3:
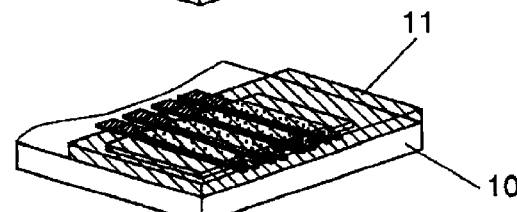
Figure 3:
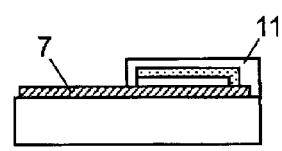
Figure 3:
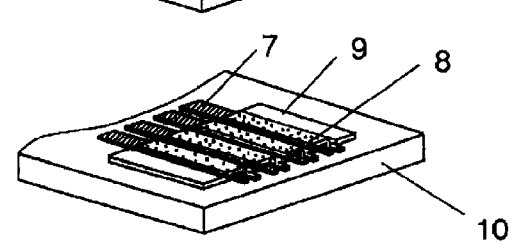
Figure 3:
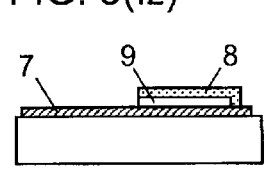
Figure 4:
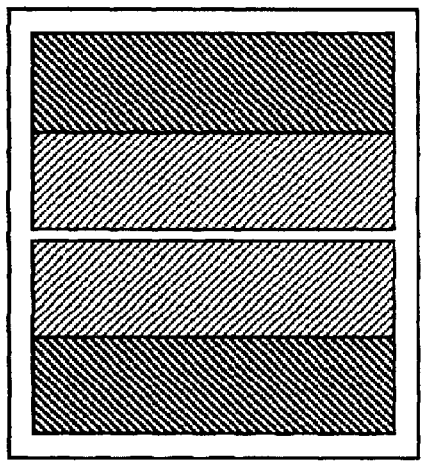
FIGS. 4($a$)–4($c$) show a schematic plan view illustrating two OEL elements on one substrate having different numbers of layers in accordance with the first embodiment of the invention.
Figure 4:
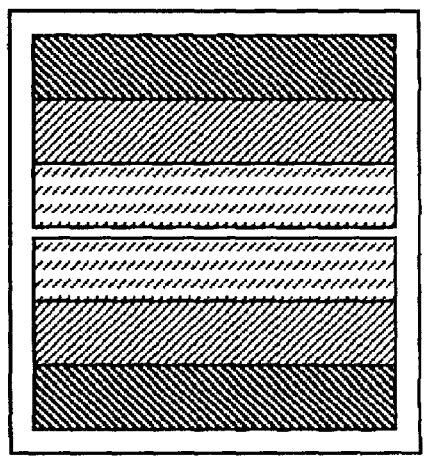
Figure 4:
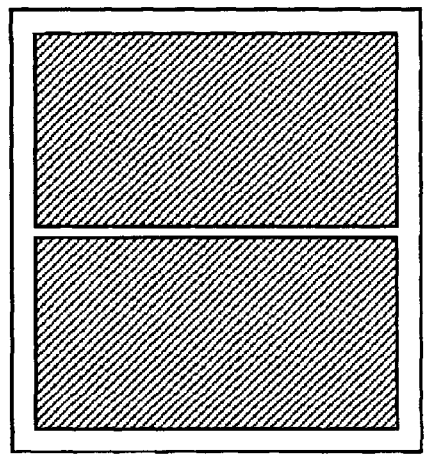

An exemplary manufacturing method of the OEL element of the first embodiment is described as follows. FIGS. 3(a1)–3(f2) show laminated layer structures in respective manufacturing processes of the first embodiment of the invention. The left half of FIGS. 3(a1)–3(f2) are a perspective view and the right half of FIGS. 3(a1)–(f2) are a sectional view along line Y—Y of FIG. 3(a1).

An "ITO" layer of 160 nm thickness is formed on glass substrate 10 using a spattering method. A photoresist (OFPR-80 manufactured by Tokyo Ohka Kogyo Co., LTD.) layer of 10 μm thickness is spin-coated on the ITO layer. The resist layer is exposed and developed, whereby the resist layer is patterned in a given pattern. The substrate is dipped in hydrochloric acid of 50% at 60° C. and the ITO layer, on which the resist layer is not formed, is removed by etching. As shown in FIG. 3(a1), the resist layer is removed, so that first ITO anode 7 is obtained, where the ITO layer is formed in a stripe pattern having line number 176 and pitch of 0.198 mm.

An "AlN" layer of 5 nm thickness is formed on glass substrate 10 having the ITO layer patterned, and a $SiO_2$ layer of approximately 50 nm thickness is formed on the AlN layer. As shown in FIGS. 3(b1) and 3(b2), the AlN layer and the $SiO_2$ layer constitute insulator 9, thereby forming a two-layers structure.

Second anode 8 (an ITO layer) is formed in a stripe pattern on insulator 9. As shown in FIGS. 3(c1) and 3(c2), second anode 8 is formed as the same processes as first anode 7. Second anode 8 has the same number of lines, and the same width and pitch as first anode 7, but the length of second anode 8 is approximately half of first anode 7.

As shown in FIGS. 3(d1)–(d2), resist 11 is patterned in a given pattern covering second anode 8. The $SiO_2$ layer on which resist layer is not formed is removed by hydrogen fluoride, and then the AlN layer under the $SiO_2$ layer is removed by a reactive-ion-etching method. As shown in FIGS. 3(e1)–(e2), after insulator 9 is removed, approximately half of first anode 7 is appeared on the surface.

As shown FIGS. 3(f1)–(f2), resist 11 is removed, then glass substrate 10, on which second anode 8 insulated by insulator 9 is formed on first anode 7, is obtained. As shown FIG. 2, lead-wires are patterned, so that lead-wires of first anode 7 do not contact to lead-wires of second anode 8.

The remaining manufacturing processes are described without reference to a drawing. First, glass substrate 10, on which laminated anodes (signal electrodes) are formed, is washed in detergent (e.g., Semicoclean manufactured by Furuuchi Chemical Company) using ultrasonic vibration for 5 minutes. Second, substrate 10 is washed with pure water using ultrasonic vibration for 10 minutes. Third, substrate 10 is washed with ammonia water/hydrogen peroxide aqueous solution/water (volume ratio 1:1:5) using ultrasonic vibration for 5 minutes. Finally, substrate 10 is washed with pure water at 70° C. using ultrasonic vibration for 5 minutes. After washing, water remaining on glass substrate 10 is removed by nitrogen blower. Then substrate 10 is heated and dried up at 250° C.

TPD of approximately 50 nm thickness is formed as hole transporting layer 4 on glass substrate 10 by resistor-heating vacuum deposition at $2 \times 10^{-6}$ Torr ($2.66 \times 10^{-4}$ Pa).

Alq3 of approximately 60 nm thickness is formed as emitting layer 5 on hole transporting layer 4 by resistor-heating vacuum deposition. Deposition rates of TPD and Alq3 are 0.2 nm/sec.

Cathode 6 of 150 nm thickness is then formed on emitting layer 5 by resistor-heating vacuum deposition, where Al—Li alloy including 15 at % Li is used as a metal source for deposition.

Cathodes 6 are formed on substrate 10, for example, by the same method which is disclosed in Japanese Patent Non-Examined Publication No. H11-121168. A wall (not shown), which is formed using $Cr_2O_3$ and resist, crosses first anode 7 and second anode 8 at right angles and used for separating cathode 6 into striped patterns (line numbers= 220, pitch=0.198).

The structure of the OEL element produced by the method described above is shown in FIG. 1. First anode 7 and second anode 8 which are formed like steps are insulated each other. Cathode 6 crosses anode 7, 8 at right angles and organic thin film 3 laminated emitting layer 5 and hole transporting layer 4 is sandwiched between cathode 6 and anode 7, 8. In the given example, scanning electrodes (cathode 6) are formed of 220 lines. Signal electrodes are formed of 176 lines of first anode 7 and 176 lines of second anode 8 on the first anode 7 via the insulator. A display area of the OEL element is divided into two sections (a scanning electrode section S2 corresponding to second anode 8 and a scanning electrode section S1 corresponding to first anode 7). S1 and S2 have 110 scanning lines respectively. As shown in FIG. 2, lead-wires from the signal lines are routed in the same direction and connected to a driving IC mounted on the substrate by a chip-on-glass (COG) method. Then the OEL apparatus is completed.

Figure 10:
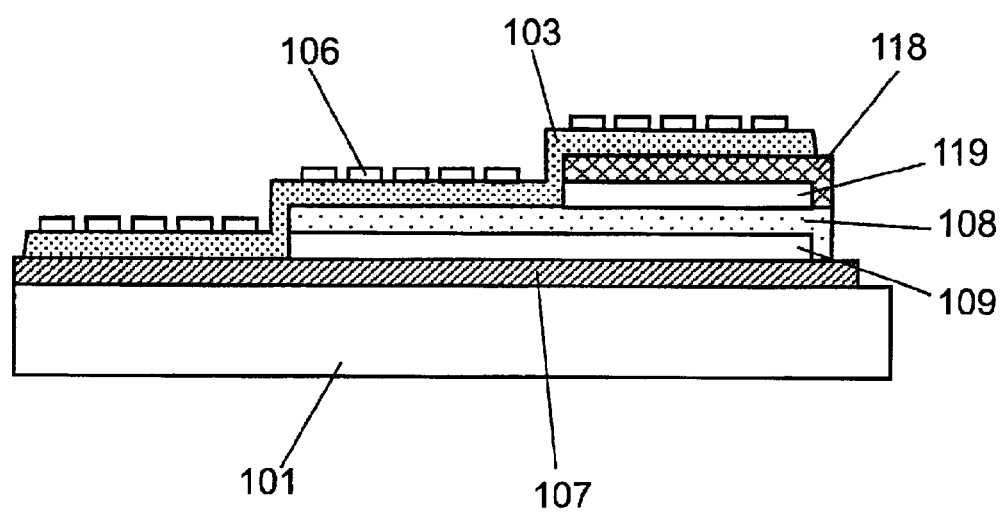
FIG. 10 shows a sectional view of an OEL element in accordance with another example of the first embodiment of the present invention.

It is noted that the laminated layers are not necessarily two layers. An example of a laminated layer comprising three layers is shown in FIG. 10. Second anode 108 is laminated on first anode 107 via insulator 109, and third anode 118 is laminated on second anode 108 via insulator 119. As shown in FIG. 10, organic thin film 103 and scanning electrode 106 are formed on signal electrodes, where signal electrodes are divided into equivalent three sections like steps. In this invention, the equivalent section is not necessary and an arbitrary section is applicable, and laminating more than four layers is also applicable.

As shown in FIG. 4(a), two OEL elements divided into two sections are located on one plane, whereby a display area is divided into four sub-areas (2 sections×2 elements= 4). A display area divided into six sub-areas (3 sections×2 elements=6) is shown in FIG. 4(b). Two OEL elements whose anode is not laminated are shown in FIG. 4(c), where a display area is divided into two sub-areas.

Figure 5:
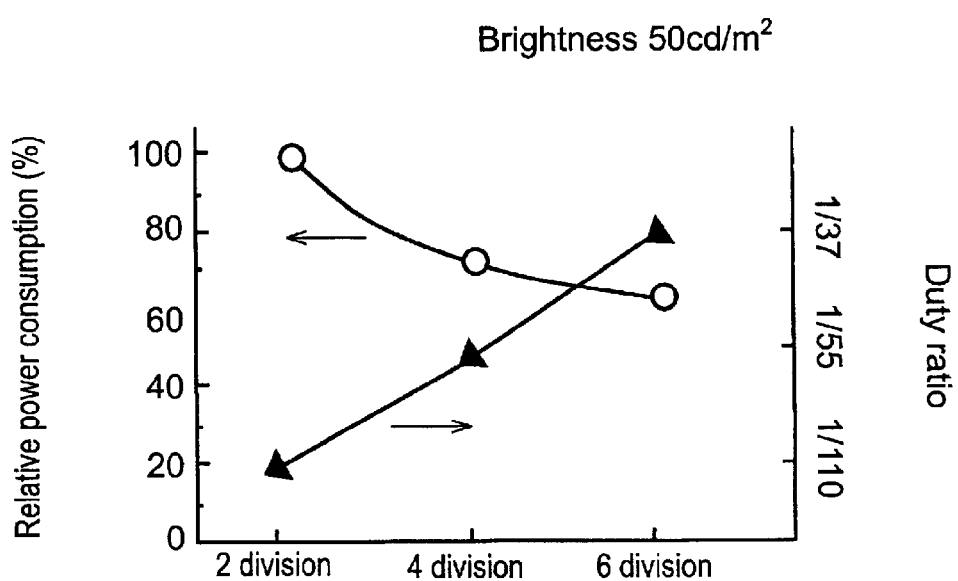
FIG. 5 is a graph showing a relation between the number of divisions vs. a duty ratio and power consumption of an OEL element in accordance with the first embodiment of the invention.

A relationship between the number of display area divisions vs. a duty ratio and power consumption for driving of the respective OEL elements is shown in FIG. 5. A dot matrix panel having 220 scanning lines and 176 signal lines is divided into two sub-areas, four sub-areas and six sub-areas respectively in FIG. 5. The duty ratios of the OEL elements divided into two sub-areas, four sub-areas and six sub-areas are 1/110, 1/55 and 1/37 respectively. Power consumption ratios required to emit light at 50 cd/m² from the three OEL elements discussed above are shown in FIG. 5. Power consumption ratios in FIG. 5 are normalized ratios, where the power consumption ratio of the OEL element divided into two sub-areas is normalized as 100%. As shown in FIG. 5, when the number of divided sub-areas increases, duty ratio of the OEL element becomes larger and power consumption thus becomes smaller.

Since laminating ITO (anodes) may cause color change of emitting light, color change at the OEL elements laminated three layers is examined, but no color change is observed.

Second Embodiment

Figure 7:
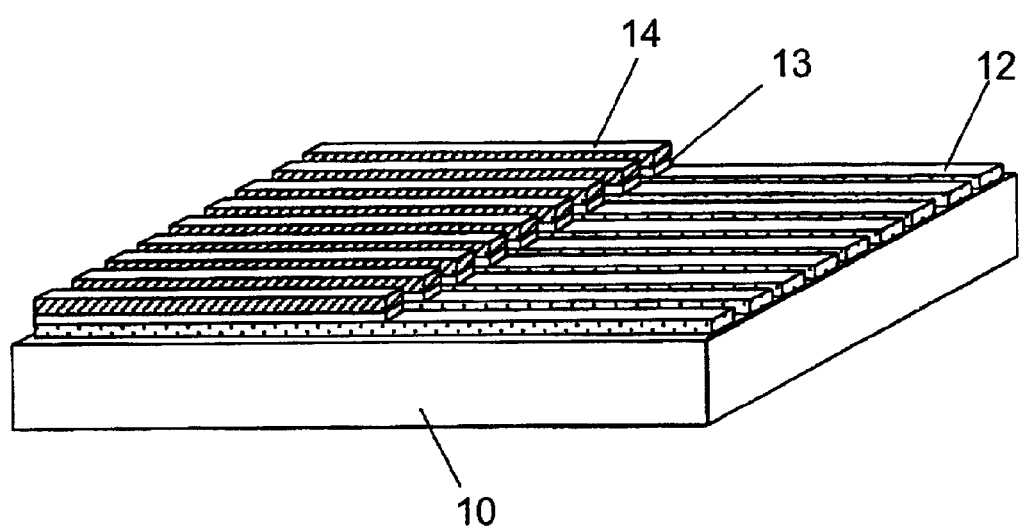
FIG. 7 shows a schematic view of an OEL element in accordance with a second exemplary embodiment of the present invention.
Figure 8:
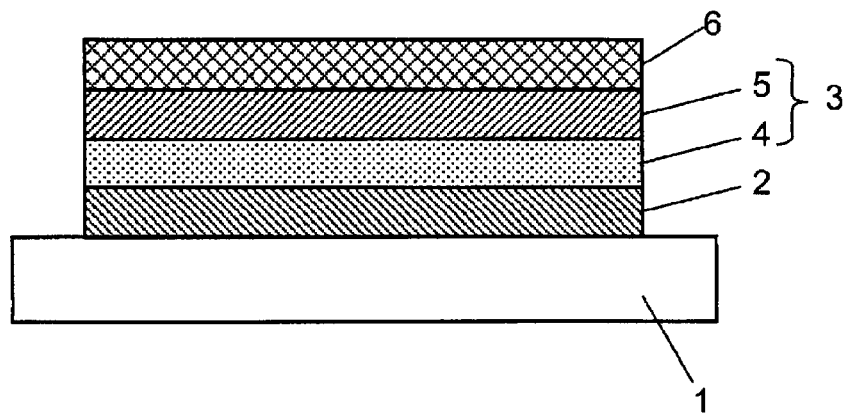
FIG. 8 shows a partial perspective view of a conventional OEL element.
Figure 9:
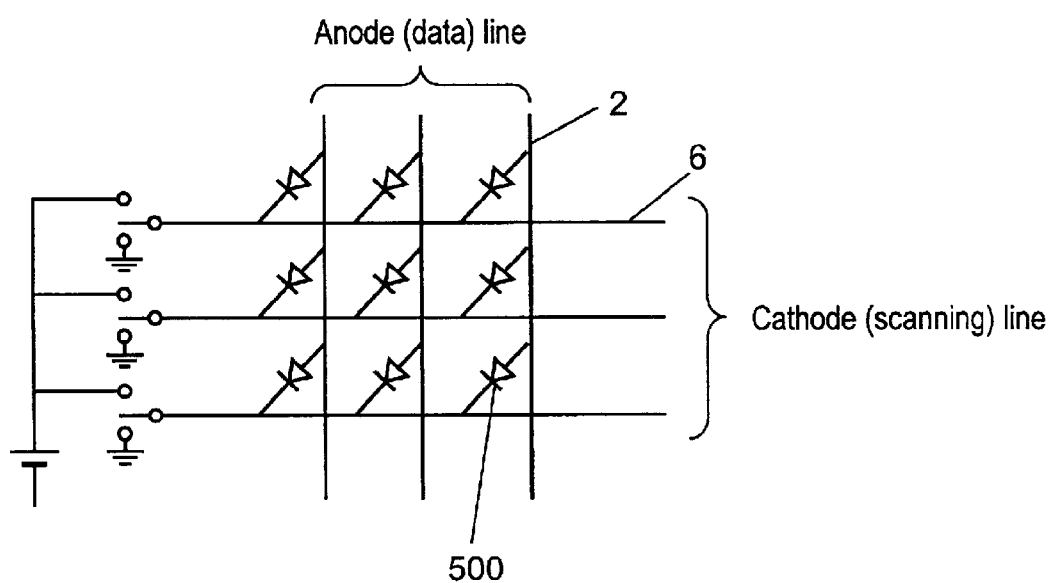
FIG. 9 shows a schematic view of an OEL element by a PM method.

An exemplary manufacturing process of an organic electroluminescent (OEL) element of the second exemplary embodiment is described hereinafter with reference to FIGS. 6(a1)–6(f2) and FIG. 7.

FIGS. 6(a1)–6(f2) show laminated layer structures in respective manufacturing processes of an OEL element. The left row of FIGS. 6(a1)–(f2) is a sectional view along line X—X of FIG. 2 and the right row of FIGS. 6(a1)–6(f2) is a sectional view along line Y—Y of FIG. 2.

As shown in FIGS. 6(a1) and 6(a2), first ITO layer 12 (a first anode) of thickness 160 nm, $SiO_2$ layer 13 of thickness 100 nm and second ITO layer 14 of thickness 160 nm are laminated successively on glass substrate 10 by a spattering method. As shown in FIGS. 6(b1) and 6(b2), photoresist (OFPR-80 manufactured by Tokyo Ohka Kogyo Co., LTD.) layer 11 of 10 µm thickness is spin-coated on the ITO layer 14. The resist layer undergoes mask-exposure of light and is developed, whereby the resist layer is patterned in a given pattern.

As shown in FIGS. 6(c1) and 6(c2), the glass substrate is etched by a reactive-ion-etching method using resist layer 11 as a mask. When ITO layer 14, on which resist layer 11 is not formed, is removed, ITO layers 12 and $SiO_2$ layer 13 are also removed in the same pattern as layer 14.

As shown in FIGS. 6(d1) and 6(d2), resist layer 11 is removed, then the whole surface of substrate 10 is coated by resist layer 11 and the half of the resist layer 11 is removed by patterning.

As shown in FIGS. 6(e1) and 6(e2), ITO layer 14, on which resist layer 11 is not formed, is removed by a reactive-ion-etching method. $SiO_2$ layer 13 is also removed in the same pattern as layer 14. As shown in FIGS. 6(f1) and 6(f2), glass substrate 10 having second ITO layer 14 is obtained by removing resist layer 11, where second ITO layer 14 (a second anode) insulated by $SiO_2$ layer 13 (an insulator) is formed on first ITO layer 12 (a first anode). As shown in FIG. 7, second ITO layer 14 is formed on first ITO layer 12 like steps on glass substrate 10.

After this, the OEL element is produced using glass substrate 10 by the same method of first embodiment. In the second embodiment as same as the first embodiment, a duty ratio of the OEL element becomes larger and power consumption thus becomes smaller.

Of course, it should be understood that a wide range of other changes and modifications can be made to the preferred embodiment described above. It is therefore intended that the foregoing detailed description be regarded as illustrative rather than limiting and that it be understood that it is the following claims including all equivalents, which are intended to define the scope of the invention.

What is claimed is:

1. An organic electroluminescent (OEL) element comprising:
   (a) a signal electrode;
   (b) a scanning electrode; and
   (c) an organic thin film disposed between said signal electrode and said scanning electrode;
   said signal electrode, said organic thin film and said scanning electrode disposed on a substrate,
   wherein said signal electrode is formed of N-layer electrodes laminated, the layers being insulated from each other, and being formed one on top of the other without any scanning electrodes being disposed in between,
   wherein a layer M electrode is formed on a layer (M−1) electrode via the insulator, an area of layer M electrode being smaller than an area of layer (M−1) electrode,
   wherein M is an integer not more than integer N and greater than 1.

2. The OEL element of claim 1, wherein a difference between an area of layer M electrode and an area of layer (M−1) electrode is approximately 1/N of a whole display area.

3. The OEL element of claim 1, wherein N is one of 2 and 3.

4. An organic electroluminescence (OEL) panel comprising a plurality of OEL elements of claim 1 on one substrate.

5. The OEL element of claim 1, wherein said signal electrode comprises patterned lines having a predetermined width and pitch.

6. The OEL element of claim 1, wherein all of said signal electrodes on layer N are formed so as to be made available on a same plane of the substrate.

7. The OEL element of claim 1, wherein said signal electrodes is an anode and said scanning electrode is a cathode.

8. The OEL element of claim 1, wherein said signal electrodes is a cathode and said scanning electrode is an anode.

9. The OEL element of claim 1, wherein said organic thin film and said scanning electrode are formed on layer N electrode and on layer (M−1) electrode not covered with layer M electrode.

10. The OEL element of claim 9, wherein said scanning electrode is an anode when said signal electrode is a cathode, or said scanning electrode is a cathode when said signal electrode is an anode.

11. The OEL element of claim 9, wherein lead-wires from said signal electrodes are routed in one direction.

12. The OEL element of claim 9, wherein a difference between an area of layer M electrode and an area of layer (M−1) electrode is approximately 1/N of a whole display area.

13. An organic electroluminescence (OEL) panel comprising a plurality of OEL elements of claim 9 on one substrate.

14. The OEL element of claim 9, wherein said signal electrodes are laminated like steps.

15. The OEL element of claim 14, wherein said organic thin film and said scanning electrode are formed on said signal electrodes.

16. The OEL element of claim 15, wherein lead-wires from said signal electrodes are routed in one direction.

17. The OEL element of claim 15, wherein a difference between an area of layer M electrode and an area of layer (M−1) electrode is approximately 1/N of a whole display area.

18. An organic electroluminescence (OEL) apparatus comprising:
   (A) an OEL element including;
      (a) a signal electrode;
      (b) a scanning electrode;
      (c) an organic thin film disposed between said signal electrode and said scanning electrode;
      said signal electrode, said organic thin film and said scanning electrode disposed on a substrate,
      wherein said signal electrode (a) is formed of N-layer electrodes laminated, the layers being insulated from each other, and being formed one on top of the other without any scanning electrodes being disposed in between,
      wherein a layer M electrode is formed on layer (M−1) electrode via the insulator, an area of layer M electrode being smaller than an area of layer (M−1) electrode,
      wherein M is an integer not more than integer N and greater than 1.
      wherein said scanning electrode (a) and said organic thin film (b) are formed on layer N electrode and on layer (M−1) electrode not covered with layer M electrode, and
   (B) driving means for driving said OEL element.

19. The OEL apparatus of claim 18, wherein said driving means is disposed on the substrate.

20. The OEL apparatus of claim 18, wherein said signal electrodes are laminated like steps, said organic thin film and said scanning electrode are formed on said signal electrodes.

21. The OEL apparatus of claim 18, wherein said OEL element further comprises lead-wires from said signal electrodes routed in one direction.

22. The OEL apparatus of claim 18, wherein said a plurality of OEL elements are formed on one substrate.

23. An organic electroluminescent element comprising:
   (a) a signal electrode;
   (b) a scanning electrode; and
   (c) an organic thin film disposed between said signal electrode and said scanning electrode;
   said signal electrode, said organic thin film and said scanning electrode disposed on a substrate,
   wherein said signal electrodes are formed of N-layer electrodes laminated, the layers being insulated from each other,
   wherein a layer M electrode is formed on a layer (M−1) electrode via the insulator, an area of layer M electrode being smaller than an area of layer (M−1) electrode,
   wherein M is an integer not more than integer N and greater than 1, and
   wherein a difference between an area of layer M electrode and an area of layer CM−1) electrode is approximately 1/N of a whole display area.

24. An organic electroluminescent element comprising:
   (a) a signal electrode;
   (b) a scanning electrode; and
   (c) an organic thin film disposed between said signal electrode and said scanning electrode;
   said signal electrode, said organic thin film and said scanning electrode disposed on a substrate,
   wherein said signal electrodes are formed of N-layer electrodes laminated, the layers being insulated from each other,
   wherein a layer M electrode is formed on a layer (M−1) electrode via the insulator, an area of layer M electrode being smaller than an area of layer (M−1) electrode,
   wherein M is an integer not more than integer N and greater than 1,
   wherein said organic thin film and said scanning electrode are formed on layer N electrode and on layer (M−1) electrode not covered with layer M electrode, and
   wherein a difference between an area of layer M electrode and an area of layer (M−1) electrode is approximately 1/N of a whole display area.

25. An organic electroluminescent element comprising:
   (a) a signal electrode;
   (b) a scanning electrode; and
   (c) an organic thin film disposed between said signal electrode and said scanning electrode;
   said signal electrode, said organic thin film and said scanning electrode disposed on a substrate,
   wherein said signal electrodes are formed of N-layer electrodes laminated, the layers being insulated from each other,
   wherein a layer M electrode is formed on a layer (M−1) electrode via the insulator, an area of layer M electrode being smaller than an area of layer (M−1) electrode,
   wherein M is an integer not more than integer N and greater than 1,
   wherein said organic thin film and said scanning electrode are formed on layer N electrode and on layer (M−1) electrode not covered with layer M electrode,
   wherein said signal electrodes are laminated like steps,
   wherein said organic thin film and said scanning electrode are formed on said signal electrodes, and
   wherein a difference between an area of layer M electrode and an area of layer (M−1) electrode is approximately 1/N of a whole display area.

26. An organic electroluminescent (OEL) element comprising:
   (a) an anode;
   (b) an organic thin film; and
   (c) a cathode;
   said anode, said organic thin film and said cathode disposed on a substrate,
   wherein said anode is formed of N-layer electrodes laminated, the electrodes being insulated from each other, and being formed one on top of the other without any cathodes being disposed in between,
   wherein a layer M electrode is formed on a layer (M−1) electrode via the insulator, an area of layer M electrode being smaller than an area of layer (M−1) electrode,
   wherein M is an integer not more than integer N and greater than 1.

27. An organic electroluminescent (OEL) element comprising:
   (a) an anode;
   (b) an organic thin film; and
   (c) a cathode;
   said anode, said organic thin film and said cathode disposed on a substrate,
   wherein said cathode is formed of N-layer electrodes laminated, the electrodes being insulated from each other, and being formed one on top of the other without any anodes being disposed in between,
   wherein a layer M electrode is formed on a layer (M−1) electrode via the insulator, an area of layer M electrode being smaller than an area of layer (M−1) electrode,
   wherein M is an integer not more than integer N and greater than 1.

* * * * *